(12) United States Patent
Mariani (10) Patent No.: US 9,898,379 B2
(45) Date of Patent: Feb. 20, 2018

(54) METHOD FOR MEASURING THE EFFECT OF MICROSCOPIC HARDWARE FAULTS IN HIGH-COMPLEXITY APPLICATIONS IMPLEMENTED IN A HARDWARE ELECTRONIC SYSTEM, AND CORRESPONDING SYSTEM AND COMPUTER PROGRAM PRODUCT

(71) Applicant: Intel Corporation, Santa Clara, CA (US)

(72) Inventor: Riccardo Mariani, San Giuliano Terme (IT)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 14/928,619

(22) Filed: Oct. 30, 2015

(65) Prior Publication Data

US 2016/0124824 A1    May 5, 2016

(30) Foreign Application Priority Data

Oct. 31, 2014    (IT) .............................. TO2014A0902

(51) Int. Cl.
| | | |
|---|---|---|
| G06F 11/00 | (2006.01) | |
| G06F 11/26 | (2006.01) | |
| G06F 11/263 | (2006.01) | |
| G06F 17/50 | (2006.01) | |

(52) U.S. Cl.
CPC ............ *G06F 11/261* (2013.01); *G06F 11/26* (2013.01); *G06F 11/263* (2013.01); *G06F 17/5009* (2013.01); *G06F 17/5095* (2013.01)

(58) Field of Classification Search
CPC ...... G06F 11/261; G06F 11/26; G06F 11/263; G06F 17/5009; G06F 17/5095
USPC .................................. 714/41, 25, 28, 33, 37
See application file for complete search history.

(56) References Cited

U.S. PATENT DOCUMENTS

| | | |
|---|---|---|
| 7,472,051 B2 | 12/2008 | Mariani et al. |
| 7,937,679 B2 | 5/2011 | Mariani |
| 8,468,503 B2 | 6/2013 | Grosse et al. |
| 8,990,746 B1 * | 3/2015 | Goyal ................. G06F 17/5022 716/106 |

(Continued)

OTHER PUBLICATIONS

Italian Search Report completed on Mar. 25, 2015, for corresponding Italian Application No. TO2014A000902.

(Continued)

*Primary Examiner* — Joseph D Manoskey
(74) *Attorney, Agent, or Firm* — Schwabe, Williamson & Wyatt, P.C.

(57) ABSTRACT

A method for measuring the effect of microscopic hardware faults in high-complexity applications includes carrying out on a processing system a step of simulation of an electronic system that executes a software instance of the application. The simulation step includes injecting faults at a microscopic level and measuring a corresponding final effect. The operation of injecting faults includes selecting a microscopic fault to be injected, selecting a mutant corresponding to the microscopic fault, applying the selected mutant to the software instance to obtain a mutated instance, simulating the electronic system that executes the mutated instance, and measuring the corresponding effect.

16 Claims, 8 Drawing Sheets

(56) References Cited

U.S. PATENT DOCUMENTS

| | | | | | |
|---|---|---|---|---|---|
| 2007/0294655 | A1* | 12/2007 | Campos | ............... | G06F 17/5009 716/106 |
| 2014/0089872 | A1* | 3/2014 | Galpin | ................ | G06F 17/5022 716/102 |
| 2015/0040096 | A1* | 2/2015 | Chang | ................ | G06F 17/5081 716/136 |
| 2015/0121323 | A1* | 4/2015 | Gou | .................... | G06F 17/5022 716/103 |
| 2015/0254383 | A1* | 9/2015 | Tso-Sheng | .......... | G06F 17/5022 716/107 |

OTHER PUBLICATIONS

Yue Jia et al, "An Analysis and Survey of the Development of Mutation Testing", IEEE Transactions on Software Engineering, vol. 37, No. 5, Sep./Oct. 2011, pp. 649-678 (XP011360267).

Rakesh Rana et al., "Improving Fault Injection in Automotive Model Based Development Using Fault Bypass Modeling", 2nd Workshop on Software-Based Methods for Robused EmbeddedSystems (SOBRES '13), kOBLENZ, Germany, Sep. 2013 (XP055178177A).

R. Robache et al., "A Methodology for System-Level Fault Injection Based on Gate-Level Faulty Behavior", New Circuits and Systems Conference (NEWCAS), 2013, IEEE 11TH International, IEEE, Jun. 16, 2013, pp. 1-4 (XP032447613).

Rickard Svenningsson et al. "MODIFI: a MODel-Implemented Fault Injection Tool", E. Schoitsch (Ed.): SAFECOMP 2010, LNCS 6351, pp. 210-222, 2010. (XP019151364).

Sasa Vulinovic et al., "Model Based Dependability Evaluation for Automotive Control Functions", Jan. 1, 2005, Retrieved from the Internet: URL: http://www:informatik.hu-berlin.de/hs/Publikationen/2005_SimSafe_Vulinovic-Schlingloff_Model-based-dependability-evaluation.pdf. (XP055178442).

* cited by examiner

METHOD FOR MEASURING THE EFFECT OF MICROSCOPIC HARDWARE FAULTS IN HIGH-COMPLEXITY APPLICATIONS IMPLEMENTED IN A HARDWARE ELECTRONIC SYSTEM, AND CORRESPONDING SYSTEM AND COMPUTER PROGRAM PRODUCT

CROSS-REFERENCE TO RELATED APPLICATIONS

This application claims priority to Italian Patent Application No. TO 2014 A 000902, filed on Oct. 31, 2014, the entire disclosure of which is incorporated herein by reference.

TECHNICAL FIELD

The present disclosure relates to techniques for measuring the effect of microscopic hardware faults in high-complexity applications implemented in a hardware electronic system, these techniques comprising originating causes of hardware fault at a microscopic level and measuring a corresponding final effect in the aforesaid high-complexity application. Various embodiments may be applied to functional safety, in particular in electronic systems in the field of industrial robotics and industrial controls, and in the technical field of electronic systems for automotive applications of driving assistance and partially or completely automatic driving.

TECHNOLOGICAL BACKGROUND

Functional-safety standards such as the standard IEC 61508 and the standard ISO 26262 require, for electronic systems used in applications critical for life, testing of the capacity of the above systems to detect or tolerate hardware faults or software errors.

With the increase in use of electronic systems, the above critical applications are increasingly complex, which in this case by "complexity" is meant the complexity of the software functions that are carried out. The complexity may, for example, be measured via the so-called 'cyclomatic complexity' developed by Thomas J. McCabe in 1976.

An example of the above high-complexity critical applications is the autonomous-drive vehicle, i.e., a motor vehicle that is able to move without or with limited human intervention. It is evident on the one hand that a fault in such a vehicle may have very serious consequences for passengers or pedestrians and on the other hand that this application is very complex because it is made up of a number of software functions strictly interfaced with one another (detection of lane, detection of distance from the surrounding vehicles, reading of traffic signals, etc.).

As has been said, functional-safety standards concern both hardware faults and software errors. The solutions discussed herein refer specifically to hardware faults.

One of the methods referred by the aforementioned standards for testing the capacity of the system to detect or tolerate hardware faults is the so-called "fault injection", i.e., a form of test that envisages intentional injections of faults in order to verify that these faults do not have any effect on the application or else are detected by appropriate control systems.

Hardware-fault injection techniques are known in the prior art but present two main drawbacks.

When hardware-fault injections are carried out at the level of testing of a physical electronic system in the laboratory, these techniques are able to measure the effect of macroscopic hardware faults such as, for example, lack of power supply or failure of a connection at the printed-circuit level, but are altogether unable to measure the effect of microscopic faults such as, for example, the effect of a fault on a transistor of one of the integrated circuits forming part of the electronic system, because at a laboratory level it is not possible to inject such faults into the integrated circuit other than by extremely costly operations (such as, for example, irradiation of the component with alpha particles).

When hardware-fault injections are carried out at a level of hardware simulation of the electronic system, as indicated, for example, in the U.S. Pat. No. 7,472,051 B2 filed in the name of the present applicant, these techniques are able to measure the local effect of a hardware fault, i.e., for example how an integrated circuit reacts at its pins in the case of a microscopic fault such as failure of a transistor inside the integrated circuit. However, these techniques become ineffective when it is desired to measure the final effect, i.e., the effect that the microscopic fault has on the final application. For example, in an autonomous-drive vehicle, the final effect of interest caused by a microscopic fault may be activation of the braking system when it is not necessary, caused by an erroneous detection of an obstacle. It is possible to imagine how measuring the final effect starting from injection of a microscopic fault, for example for the entire duration of the simulation time, is not feasible since the distance in time (understood as the chain of events between cause and effect) between the initial cause (i.e., the microscopic physical fault) and the final macroscopic effect (i.e., erroneous detection of an obstacle) is too long.

Figure 1:
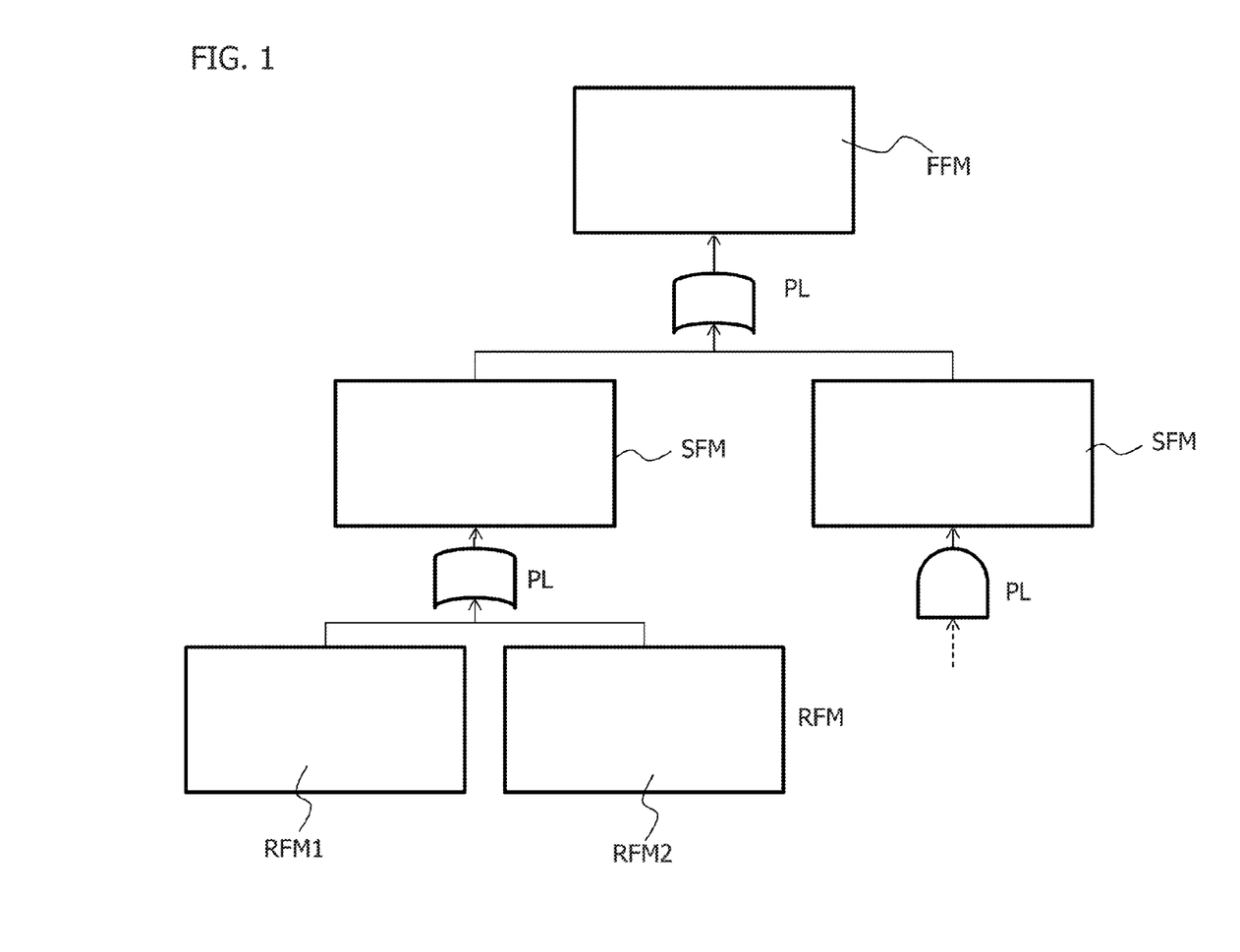

In this regard, FIG. 1 is a schematic representation of failure modes, which are identified in the framework of procedures for measuring the effect of microscopic hardware faults in high-complexity applications implemented in a hardware electronic system, i.e., checking of the functional safety of electronic systems for critical applications. These failure modes correspond to incorrect behaviour of the electronic device or system as compared to its behaviour according to specifications. These failure modes regarding the device or system, referred to as the final effects, or final failure modes FFM, are represented, for example in the automotive field, by events such as "activation of the braking system when not necessary". As may be seen from FIG. 1, if the electronic system is broken down into its subsystems and components, these final effects FFM may be brought back (via simple logic operations represented by logic gates PL, for example, AND or OR gates), through levels of other resulting failure modes, SFM, to other "root" failure modes, RFM, i.e., failure modes linked more directly to the components of the system. For example, in the case of an integrated circuit, a root failure mode RFM1 may be "erroneous calculation by the processor", which, in logic OR with another root failure mode RFM2 "erroneous address by the processor during memory access", may constitute a higher-level failure mode ("resulting" failure mode SFM) such as, for example, "erroneous operation of the processor". By combining one or more levels of resulting failure modes, the final failure mode FFM is finally obtained, which, as has been said, is hence a logic combination of root failure modes RFM. In this sense, it is understood that the chain of events between microscopic cause and final effect may be very long, i.e., the number of levels that links, for example, the root failure mode RFM1 to the final effect FFM may be very large.

In systems for critical applications, as required by the international standards IEC 61508 and ISO 26262, safety mechanisms are implemented, which are able to prevent or detect the aforesaid failure modes. For example, in the case of integrated circuits, a safety mechanism is a software executed periodically during normal operation of the device for testing all the instructions of a processor.

The international standards IEC 61508 and ISO 26262 require said safety mechanisms to achieve certain values of "diagnostic coverage", i.e., a certain ratio between the number of dangerous faults (i.e., faults that are such as to perturb the critical mission of the system) and the number of faults detected by the diagnostic mechanism.

In this case, the purpose of the test on functional safety is to verify that—given the set of the microscopic hardware faults possible—the number of dangerous faults and the number of important faults detected by the diagnostic mechanism are those taken into account in the stage of design of the electronic system.

Figure 2:
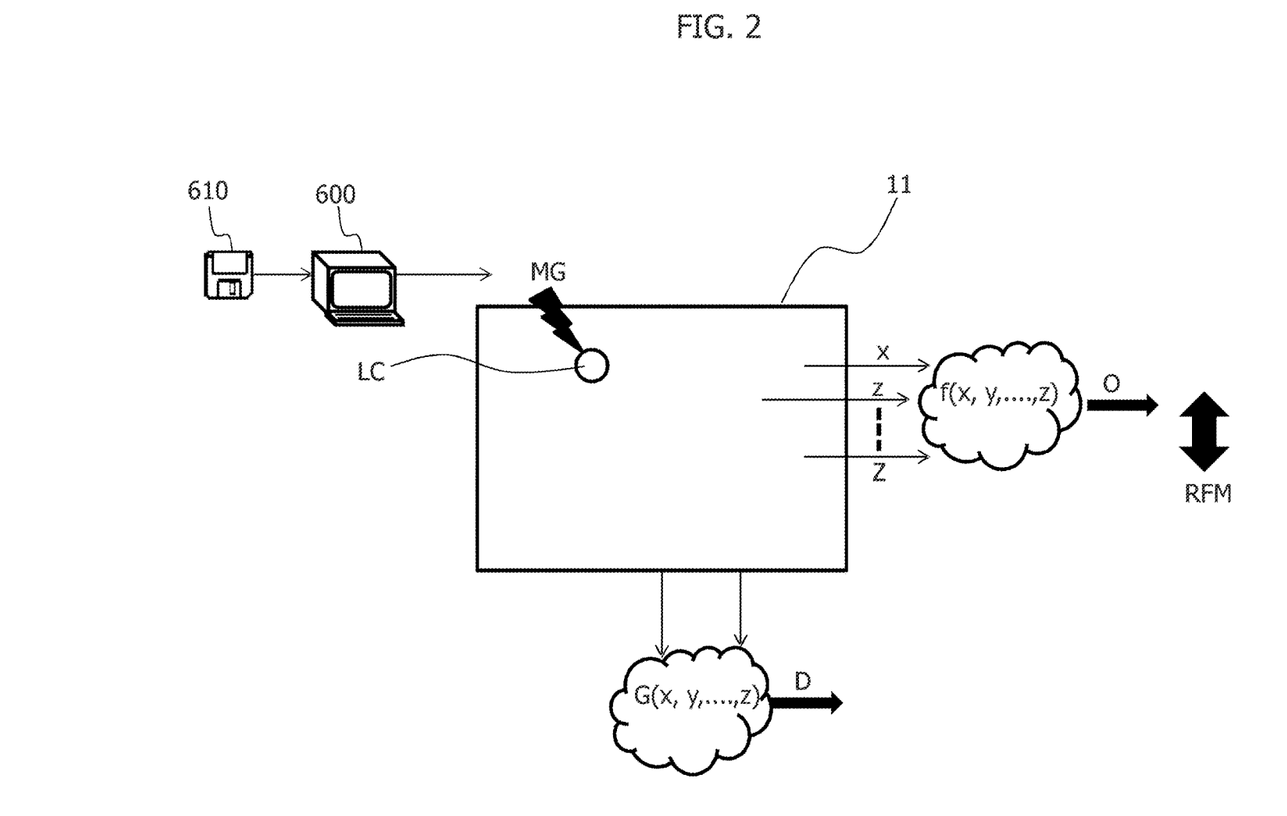

FIG. 2 is a schematic illustration of elements and steps for measuring the effect of microscopic hardware faults in high-complexity applications implemented in a hardware electronic system undergoing testing, for example an integrated circuit, designated by the reference number 11. FIG. 2 represents a microscopic fault G injected at a location LC, in the integrated circuit 11 under test. Denoted by x, y, . . . , z is a plurality of designated outputs of the integrated circuit 11 under test. A function f(x, y, . . . , z) of these designated outputs x, y, . . . , z represents a point of observation O of the fault MG. A second function G (x, y, . . . , z) of the designated outputs x, y, . . . , z represents a diagnostic point D. Of course, these quantities and the related operations and functions are defined for a step of simulation of the integrated circuit 11 under test, for example via a computer 600 that can load in memory and execute a computer program product 610, in particular on a computer medium, or a non-volatile computer-readable medium, which comprises one or more of the operations of the method described herein, even though in general these operations could be carried out on the physical circuit, albeit with the difficulties discussed previously.

The above measurement of the effects of hardware faults may be incorporated in a step of simulation of the electronic system or circuit 11 with fault injection, which, typically, comprises:

injecting microscopic faults MG during simulation (for example faults of the stuck-at type) of the circuit 11 in given locations LC thereof;

verifying whether a certain function f(x, y, . . . , z) of the designated outputs x, y, . . . , z, or observation point O is perturbed by the fault, i.e., whether the observation point O has a measured value different from an expected value; in this case, the fault G is defined as potentially dangerous fault; otherwise, it is a safe fault; i.e., it does not cause a failure of the critical mission; the designated outputs x, y, . . . , z are the outputs of the integrated circuit the combination of which can, that is, determine the root failure mode RFM; for example, the root failure mode "erroneous calculation by the processor" has as designated outputs the outputs of the processor;

in the case of (potentially) dangerous fault, verifying whether the second function G(x, y, . . . , z) of the outputs corresponding to the safety mechanism ("diagnostic point", D) is activated (i.e., for example, the value of G(x, y, . . . , z) differs from a precalculated value) by the dangerous fault, i.e., whether, when the observation point O assumes a measured value different from the expected value, the diagnostic point D is activated within a certain time interval identified by the safety specifications of the electronic device 11. If the diagnostic point D is activated, a condition of dangerous fault is understood as having been detected. For instance, in the case where the safety mechanism is a software executed periodically, the diagnostic point D is represented by the register of the processor or by the memory location in which the software stores its measured value to be compared with a pre-calculated value of the test (i.e., the expected value without faults). Usually, fault injection occurs while a generator of working load requests execution of commands, in particular for example an application in functional safety, by the electronic system. Monitoring modules are provided for tracing execution of the commands and gathering the data, for example from the aforesaid observation points, and analysis modules, which carry out, for example, evaluation of the dangerous faults, for instance according to FMEA analysis. All these modules may be software modules run on a computer, which more in general executes the simulation procedure. Similar procedures are described, for example, in the U.S. Pat. No. 7,937,679 filed in the name of the present applicant.

OBJECT AND SUMMARY

The embodiments described herein have the purpose of improving the potential of the methods according to the known art as discussed previously, in particular reducing the distance between the potential initial microscopic cause and the measurement of the final effect, and hence overcome the two drawbacks described above; i.e., they enable very high measurement rates and enable operations of modification to originate the above causes at the level of microscopic faults.

Various embodiments achieve the above object thanks to a method having the characteristics recalled in the ensuing claims. Various embodiments may refer also to a simulation system as likewise to a computer program product, which can be loaded into the memory of at least one computer (e.g., a terminal in a network) and comprise portions of software code that are designed to execute the steps of the method when the program is run on at least one computer. As used herein, the above computer program product is understood as being equivalent to a computer-readable means containing instructions for controlling the computer system so as to co-ordinate execution of the method according to the invention. Reference to "at least one computer" is meant to highlight the possibility for the present invention to be implemented in a modular and/or distributed form. The claims form an integral part of the technical teachings provided herein in relation to the invention.

Various embodiments may envisage that the method comprises an operation of fault injection, which includes selecting a microscopic fault to be injected, selecting in a library of software mutants a mutant corresponding to the microscopic fault to be injected, applying the selected mutant to said software instance to obtain a mutated instance, simulating the electronic system or circuit that executes the aforesaid mutated instance in a given test scenario, and measuring the effect corresponding to the mutated instance.

Various embodiments may envisage selecting or creating, as a function of the microscopic fault to be injected, a sequence of scenarios comprising stress parameters for stressing the instance of the critical application, the simulation and measurement operations being carried out a plurality of times according to the sequence of test scenarios.

Various embodiments may envisage selecting a microscopic fault to be injected by carrying out an analysis of the electronic system in order to identify a set of microscopic hardware faults to be injected, and identifying in the set of microscopic hardware faults the most probable microscopic hardware faults, whereas the operation of selecting a software mutant corresponding to the microscopic fault to be injected comprises building a library (of software mutants, in particular organized by type, persistence, and amount of mutants to be applied), and selecting, from said library, mutants (corresponding to the potential most probable microscopic hardware faults).

Various embodiments may envisage measuring the effect corresponding to the mutated instance, detecting the final effect, and classifying it according to classes of final effect, which, in particular, comprises classes of expected event, safety event, and erroneous event.

Various embodiments may envisage carrying out a step of calculation of safety indices of the microscopic fault as a function of results of the above classification step by:
- computing the number of expected events, safety events, and erroneous events for a test sequence performed with a given mutant;
- computing, as a function of the number of expected events, safety events, and erroneous events, safety and diagnostic-coverage factors and associating these factors to the microscopic fault selected.

The solution described makes it possible, in an extremely simple and automatic way, to connect microscopic hardware faults to their final effects. Use of software mutations makes it possible to carry out fault injection on a software model, which is hence, even for extremely complex applications, both extremely fast and able to model, via the mutations, the effects caused by the aforesaid microscopic hardware faults.

BRIEF DESCRIPTION OF THE FIGURES

Various embodiments will now be described, purely by way of example, with reference to the annexed drawings, in which:

FIGS. 1 and 2 have been described previously;

DETAILED DESCRIPTION

In the ensuing description numerous specific details are provided to enable maximum understanding of the embodiments provided by way of example. The embodiments may be implemented with or without specific details, or else with other methods, components, materials, etc. In other circumstances, well-known structures, materials, or operations are not shown or described in detail so that aspects of the embodiments will not be obscured. Reference in the course of the present description to "an embodiment" or "one embodiment" means that a particular structure, feature, or characteristic described in connection with the embodiment is comprised in at least one embodiment. Hence, phrases such as "in an embodiment", "in one embodiment", and the like that may be present in various points of the present description do not necessarily refer to one and the same embodiment. Moreover, the particular structures, features, or characteristics may be combined in any convenient way in one or more embodiments.

The notation and references are provided herein only for convenience of the reader and do not define the scope or meaning of the embodiments.

In brief, the method described envisages defining a measurement method based upon execution of a software model (program) of the high-complexity critical application, modified via software mutations, i.e., intentional modifications of the program in order to emulate the effect of an error, aimed at a detailed analysis of the possible microscopic hardware faults.

This method is able to reduce the distance in time between the potential initial microscopic cause and the measurement of the final effect and hence enables very high measurement rates in so far as the measurement occurs at the level of execution of a software program and not at the level of simulation of an integrated circuit, and at the same time enables injection of mutations corresponding to microscopic faults, and hence without limiting injection to macroscopic faults alone.

Techniques of program mutations are known in themselves to the person skilled in the sector, for example from the document U.S. Pat. No. 8,468,503 B2, but are used for testing the program in regard to potential software errors.

The solution described herein uses the mutations to model the error in the program caused by a hardware fault at a microscopic level and measure a corresponding final effect in the high-complexity critical application. In particular, the solution described herein envisages use of the software mutation as tool for connecting the local effect of potential microscopic hardware faults to the macroscopic effect at the application level, passing through an intermediate level, i.e., mutation of the program so as to emulate the effect of the most probable microscopic hardware faults.

Figure 3:
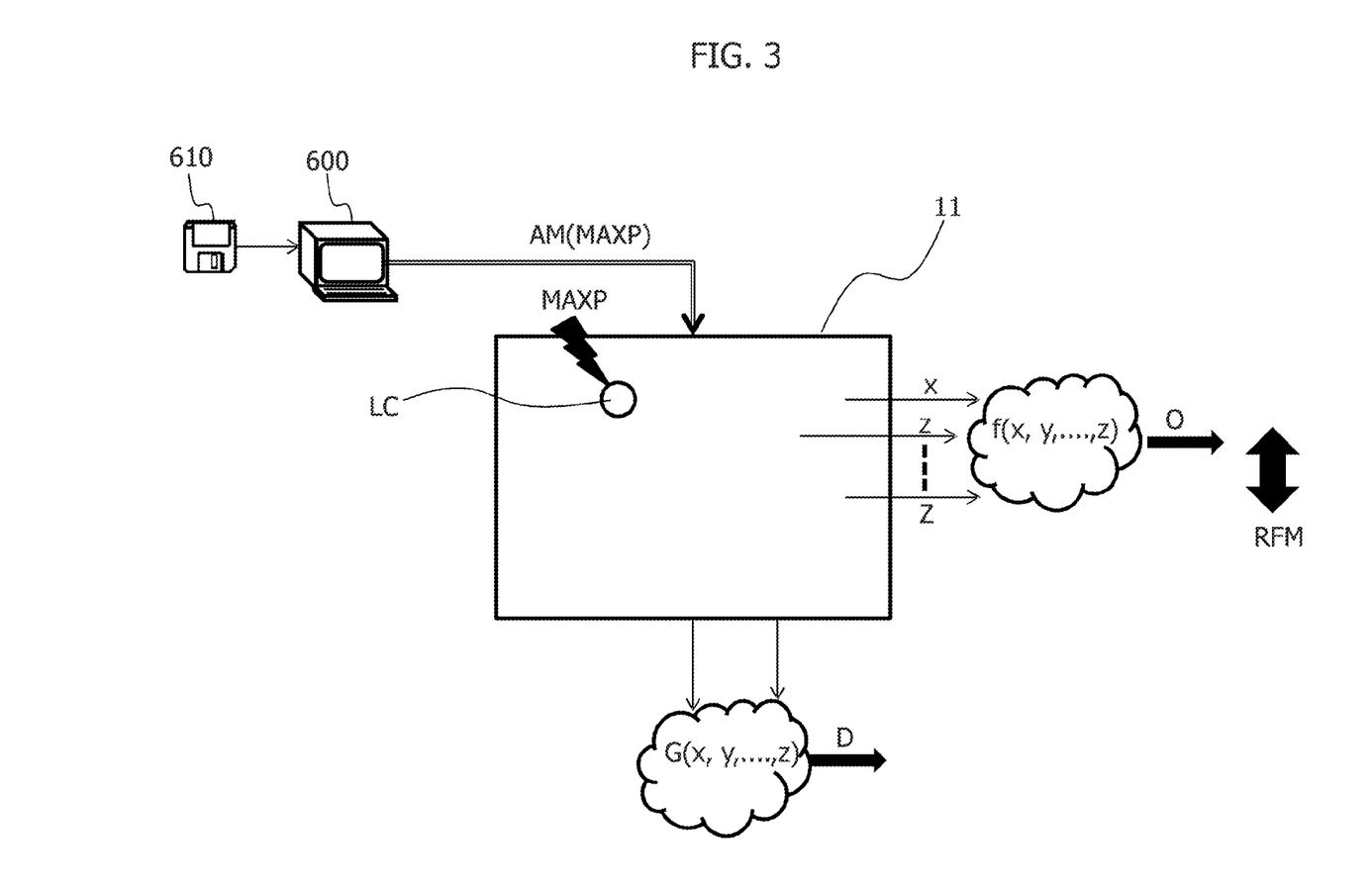
FIG. 3 shows a general diagram of a system implementing the method described.
Figure 4:
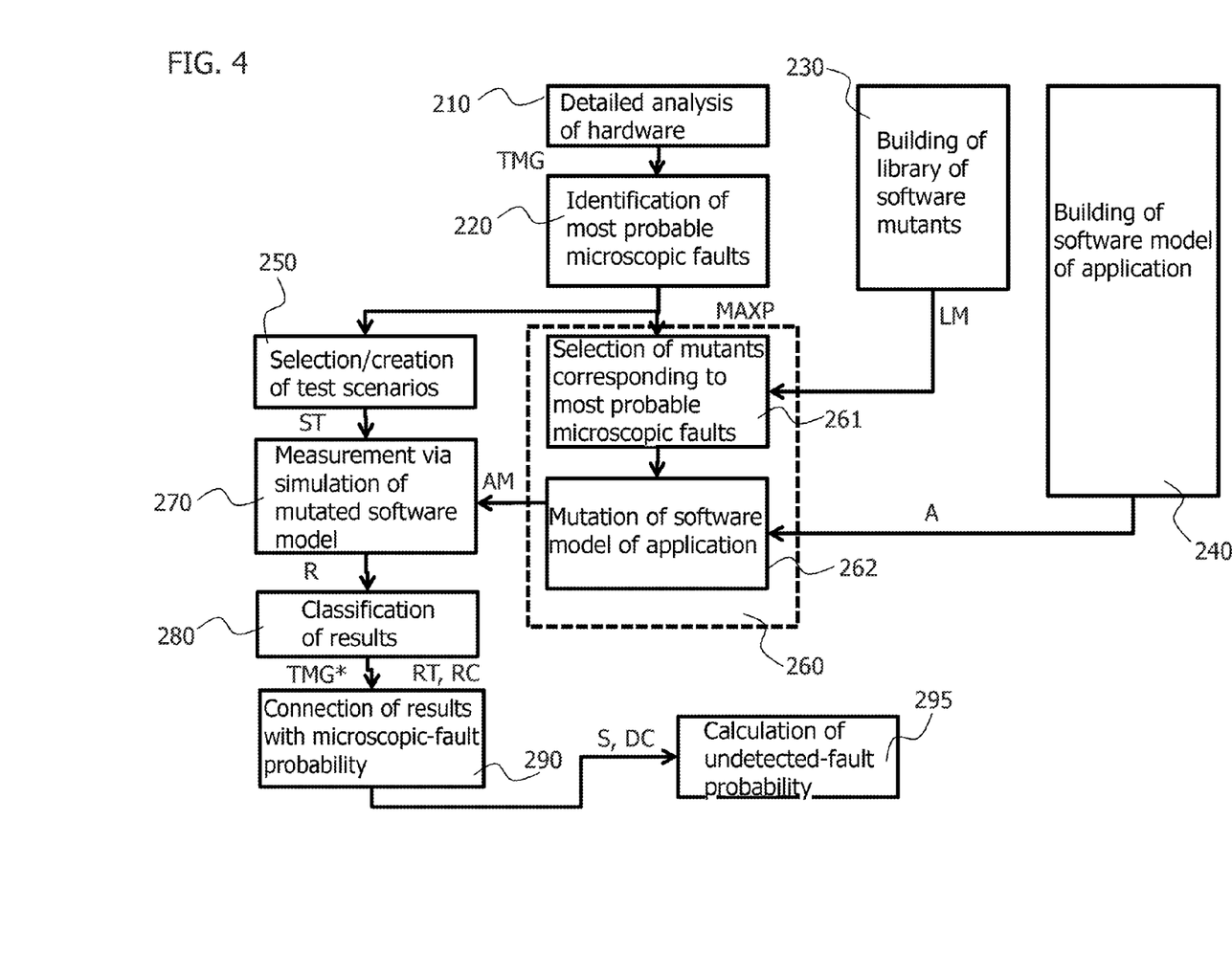
FIG. 4 shows a block diagram representing a method for measuring the effect of microscopic hardware faults described herein.

FIG. 3 is a schematic representation of a system that implements the method described herein for measuring the effect of microscopic hardware faults in high-complexity applications. As in the case of the system described with reference to FIG. 2, a processing system 600 is shown that carries out a step of simulation of the electronic system or circuit 11. However, in this case, instead of executing a software instance A of the critical application and injecting directly the faults MG at a microscopic level in locations LC, and measuring a corresponding final effect FFM in the aforesaid software instance A of the application, the method, with reference also to what is illustrated in the flowchart of FIG. 4, envisages carrying out injection of faults by: selecting a given microscopic fault MAXP to be injected; selecting, in a library of software mutants, a software mutant corresponding to the aforesaid microscopic fault MAXP to be injected; and applying the selected mutant IMUT to the software instance A to obtain a mutated instance AM, which is hence a function AM(MAXP) of the microscopic fault MAXP to be injected. There is then carried out simulation of the electronic system or circuit that executes the above mutated instance, in particular in a given test scenario, i.e., by setting given parameters of the simulation and by putting the software model that simulates the electronic system or circuit in a certain initial condition. Lastly, the final effect corresponding to the mutated instance is measured. Preferably, the scenario is set as a function of the microscopic fault MAXP to be injected.

In other words, the operation of injecting faults MG illustrated in FIG. 2 is carried out through injection of a software instance of the mutated application AM corresponding to the fault to be injected MAXP.

The mutated application AM generates a reaction of the system, which is evaluated at one or more observation points O and decision points D in order to evaluate root failure modes RFM and lastly, the consequent final effects FFM. The method described is preferably applied a number of times, according to a number of scenarios, and moreover may be applied for each fault in a list of faults identified via analysis.

FIG. 4 illustrates a block diagram of a method for measuring the effect of microscopic hardware faults in high-complexity applications implemented in a hardware electronic system, the method being designated as a whole by the reference number 200.

The above electronic system may correspond, as has been said, for example, to electronic systems for automotive applications of driving assistance and partially or completely automatic driving, which comprises a processing architecture that operates in functional safety.

Designated by 210 is a step of detailed analysis of the hardware used by the electronic system 11 under test. This analysis may envisage to operate in particular as described in the U.S. Pat. No. 7,937,679, in particular in the description regarding FIG. 3 of this document as regards division of the system 11 into elementary parts or sensitive areas. Corresponding to each sensitive area is a database record with values of safe and dangerous failure rate, divided into transient faults and permanent faults.

Figure 5:
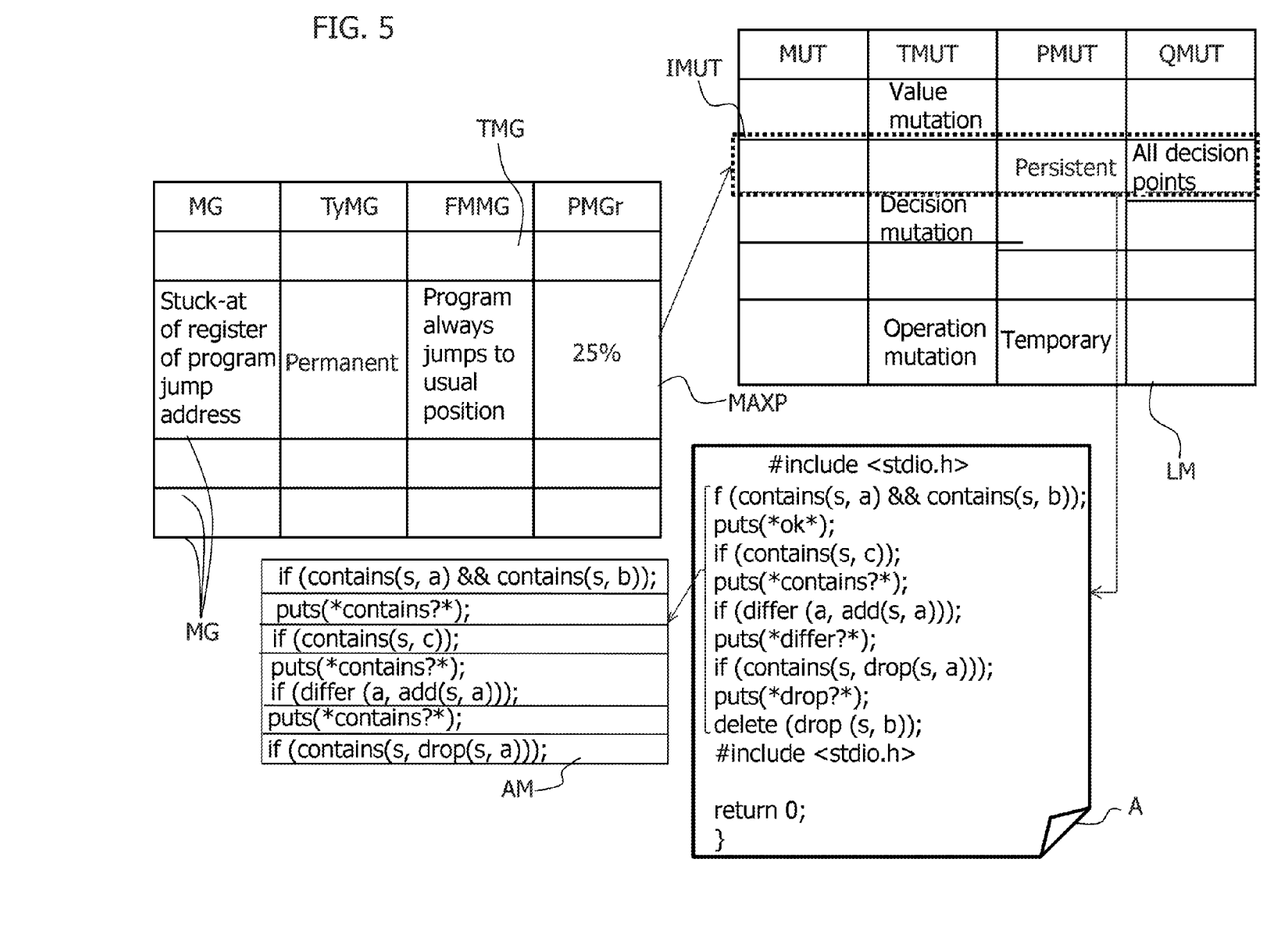
FIG. 5 shows a detailed diagram representing an operation of the method of FIG. 4.

The above step of analysis 210 comprises building a data structure, for example in the form of table TMG, shown in FIG. 5, where for each row of the table (record of the data structure) corresponding to each possible microscopic hardware fault MG, in particular to each microscopic hardware fault MG that is considered for possible injection in a simulation, there is a plurality of columns (fields), which include:
the description or name of the microscopic hardware fault MG;
its type TyMG (whether permanent or transient)
the failure mode FMMG
the relative fault probability, PMGr, i.e., the probability of fault corresponding to the given fault MG with respect to the total probability of fault of the system 11.

For example, as shown in FIG. 5, which represents the table TMG and shows in detail a record of this table corresponding to a given microscopic fault MG, the analysis identifies in the record of a hardware fault MG "stuck-at of register of program-jump address", of a type TyMG "permanent", with failure mode FMMG "program always jumps to usual position", a relative probability PMGr of fault of the electronic system of 25%. In other words, the probability of fault is caused by a stuck-at of the register of the address of program jump of a processor, which in turn, at a functional level, can cause the program to jump always to the usual position.

Hence, step 210 has as output a data structure of the microscopic faults TMG that comprises records of fields with information for each microscopic hardware fault MG that is identified or is considered as being potentially injectable.

In parallel, as shown in FIG. 1, in a step 230 a library LM of software mutants is built, i.e., a data structure, which is also shown in tabular form in FIG. 5, where each row of the table (record of the data structure) corresponds to a possible software mutant MUT, which is defined via a plurality of columns (fields) that comprise:
the type of software mutant TMUT;
the persistence PMUT (persistent or temporary);
the degree of application QMUT of the mutant, i.e., the amount of mutant MUT that is to be applied.

The table LM also comprises a column MUT with a description/identifier of the mutant, in this case a simple order number.

As has been mentioned, software mutation is a generally known technique. A software mutant MUT is a local mutation of a program.

For example the program:

```
if (a && b) {
    c = 1;
} else {
    c = 0;
}
``` is mutated into:

```
if (a || b) {
    c = 1;
} else {
    c = 0;
}
``` via a mutation of operation from && to ||.

As indicated, the type of software mutant TMUT can assume multiple values, namely, three: value mutation, decision mutation, and operation mutation. The field persistence PMUT may be either persistent or temporary. The field degree of application QMUT may have different values according to the degree of application of the mutant MUT, for example, on the basis of the number of decision points, from all the decision points, or else from all the points of program jump, to lower numbers of points of program jump, or decision points, according to the number that it is desired to set.

Building of the library LM may, in fact, be made via the description of mutants obtained from direct experience of the user of the measuring method in regard to the application A in question or else by using of mutants already described in the literature, for example, those indicated in texts such as Yue Jia, Mark Harman (September 2009) "An Analysis and Survey of the Development of Mutation Testing" (PDF), CREST Centre, King's College London, Technical Report TR-09-06, available at the URL http://crest.cs.ucl.ac.uk/fileadmin/crest/sebasepaper/JiaH10.pdf.

Organization of the library LM as shown in FIG. 5, by defining each software mutant MUT that can be used according to mutant type TMUT, persistence of the mutant PMUT, and amount of mutants to be injected QMUT, enables a connection between mutants MUT and microscopic hardware faults MG that is as automatic as possible.

It is then envisaged to order, in a step 220, all the microscopic hardware faults MG identified in step 210, i.e., in the structure TMG described previously, as a function of their relative fault probability, and execute a mutation process 260 that comprises a step 261 in which, starting from the most probable microscopic fault MAXP, in the library of mutants LM a search is made for the mutant MUT that corresponds thereto on the basis of:
persistence criterion: this associates the field fault type TyMG to the field persistence PMUT; for example, a hardware fault of a fault type TyMG "permanent" must correspond to a mutant with persistence PMUT "persistent"; examples of other values that the field persistence PMUT can assume are "transient" and "intermittent";

failure-mode criterion: this associates the field failure mode FMMG to the field mutant type TMUT; for example, a fault that entails a failure mode FMMG such that the program jumps always to the usual position must correspond to a mutant type TMUT such as a "decision mutant"; examples of other values that the field mutant type TMUT can assume are "arithmetical-operation mutant" (e.g., exchange of sum with product), "relation mutant" (e.g., exchange of greater than with less than), "purpose mutant" (e.g., exchange of a variable with another), "erasure mutant" (e.g., erasure of a step of the program), "insertion mutant" (e.g., insertion or duplication of a program step);

quantity criterion: this associates the field relative fault probability PMGr to the field amount of mutants to be injected QMUT; for example, a very probable microscopic fault, i.e., with very high relative fault probability PMGr, for example above a given threshold, must correspond to a mutant that operates on all the points of program jump, i.e., with field QMUT thus set; the value associated to the field amount of mutants to be injected QMUT may correspond to a totally random uniform distribution of the mutants (for example, in the case of a mutant type TMUT "arithmetical-operation mutant", 25% of all the arithmetical operations identified in the program are mutated) or else to a uniform distribution, but evenly distributed over various sets of program steps (for example, in the case of a mutant type TMUT "arithmetical-operation mutant", 25% of the arithmetical operations identified in the program are mutated, but this 25% is distributed over five sets corresponding, for example, to five sub-programs of the main program), or else again to a distribution that is not uniform but concentrated on the points of program of greater criticality, i.e., corresponding to program steps that are deemed (by experience or on the basis of previous mutation cycles) particularly risky for safety of the system.

The above criteria may be set, for example, via look-up tables stored in which are the associations between given values (or ranges of values) assumed by the fields of the microscopic-fault table TMG, namely, TyMG, FMMG, and PMGr, and the values of the fields of the mutant library, namely, TMUT, PMUT, QMUT. For example, between the fault type TyMG and the mutant type TMUT there may be an one-to-one association, as likewise between the failure mode FMMG and the mutant persistence PMUT, whereas ranges of values of probability PMGr correspond to different values of amount of mutants to be injected QMUT.

Preferably, the criteria are tested sequentially; namely, on the basis of the field fault type TYMG, in the library LM a set of records is identified (in FIG. 5 the records 2, 3, 4) that have a given mutant type TMUT. Then, from among the above records, the record is selected with persistence PMUT corresponding to the failure mode of the fault MG selected, i.e., the most probable microscopic fault MAXP (records 2 and 3). Finally, from among these records, the record is selected that has the amount of mutants to be injected QMUT corresponding to the relative probability PMGr of the most probable microscopic fault MAXP.

Hence, what has been discussed in the above description with reference to FIG. 5 shows how from the fault MG indicated, i.e., the most probable microscopic fault MAXP, there is selected a record of a mutant MUT with given corresponding values in the fields of the list LM. On the basis of the selection, from the library LM a selected mutant IMUT is retrieved, which corresponds, that is, to a software script that is configured for applying to the application A, in a step 262, the mutation selected, thus giving rise to a mutated application AM. For example, given an instance (software program) of the application A, such as the one represented below in code C++:

```
# include <stdio.h>
# include "new.h"
# include "Object.h"
# include "Set.h"
int main ( )
{   void * s - new(Set);
    void * a - add(s, new(object));
    void * b - add(s, new(object));
    void * c - new(Object);
    if (contains(s, a) && contains(s, b))
        puts("ok");
    if (contains(s, c))
        puts("contains?");
    if (differ(a, add(s, a)))
        puts("differ?");
    if (contains(s, drop(s, a)))
        puts("drop?");
    delete(drop(s, b));
    delete(drop(s, c));
    return 0;
}
``` the injected mutation IMUT, which is a decision mutation, brings about, in the decisions, i.e., in the constructs if of the instance A, the following result:

```
if (contains(s, a) && contains(s, b));
    puts(*contains?*);
if (contains(s, c));
    puts(*contains?*);
if (differ (a, add(s, a)));
    puts(*contains?*);
if (contains(s, drop(s, a)));
``` i.e., an instance of mutated application AM.

Once the mutant IMUT to be injected into the software instance of the application A to obtain the mutated instance AM has been identified, in a step 270 the measurement is made, via simulation, of the instance of mutated application AM in the system 11, as shown in FIG. 4. As has been said, in fact, the measurement procedure comprises execution of a software model (program) of the application, in this case the mutated application AM, executed by the electronic system 11 under test, and measurement of the final effect FFM of the above simulation.

As shown in FIG. 4, the measurement step 270 envisages executing previously two further steps:

a step 240 of building of the software model, here designated by A, of the application; this is a step well known to the person skilled in the branch: for example, it may be a model in C++ executed on INTEL processors; this step may be executed once, prior to execution of the measurement method described herein;

a step 250 of selection/creation of test scenarios ST with which to stress the software model A of the application; by test scenarios ST is meant in general bringing the aforesaid software model A of the application into a given initial condition, for example, in the case of an autonomous-drive vehicle, into a condition corresponding to a road with the presence of an obstacle but at a distance greater than the decision threshold for automatic braking and setting conditions of simulation determined by values of parameters that can be set in the simulation, for instance, in the case described above, by setting a speed of the vehicle higher than 50 km/h.

The above step 250 is executed according to the type of the microscopic fault MAXP to be injected via the mutated application AM. For example, in the case of the microscopic fault MAXP shown in FIG. 5, i.e., "stuck-at of register of program-jump address" of a processor, the function that the processor performs in the framework of the application is identified, and consequently, by negation, a test scenario is created.

Once the software model of the application has been obtained in step 240, and the set of test scenarios has been obtained in step 250, measurement 270 can be carried out, which comprises, following upon mutation 262 of the software model or instance A via the selected mutant IMUT to obtain the mutated model AM, simulating the operation of the system 11 that implements the mutated software model AM of the application.

Step 270, for a single simulation in a given test scenario ST, has as output a final effect FFM.

There is then envisaged a step 280 of classification of the results R, i.e., the final effects FFM detected, of the simulation 270 into results RC classified according to effect classes Ca, Cs, Cw.

Next, a step 290 is carried out for computing indices of safety of the microscopic fault MAXP on the basis of which the injected mutant IMUT has been selected as a function of the classified results RC obtained for the aforesaid injected mutant IMUT. In this way, by associating values of safety indices to the microscopic fault MAXP, to which a relative fault probability PMGr has already been associated, step 290 subsequently makes it possible to use, in a way connected with respect to the same microscopic fault, MAXP, the aforesaid safety indices, obtained from the results RC classified according to the classes Ca, Cs, Cw of final effect FFM, and the aforesaid relative fault probability PMGr to compute quantities representing the effect of the above microscopic fault MAXP injected. Specifically, the safety indices calculated in step 290 are the safe-fault fraction S and the diagnostic coverage DC. Preferably, following upon step 290, there may be calculated, in a step 295, for the microscopic fault MAXP, a corresponding quantity indicating the effect, such as, for example, the undetected-fault probability, calculated in particular as the product of the relative fault probability PMGr, of the complement of the safe-fault fraction (1−S), and of the complement of the diagnostic coverage, i.e., PMGr·(1−S)·(1−DC).

Preferably, step 290 is executed at the end of the number NST of iterations of the measurement step 270 that derive from the test sequence set in step 250.

Figure 6:
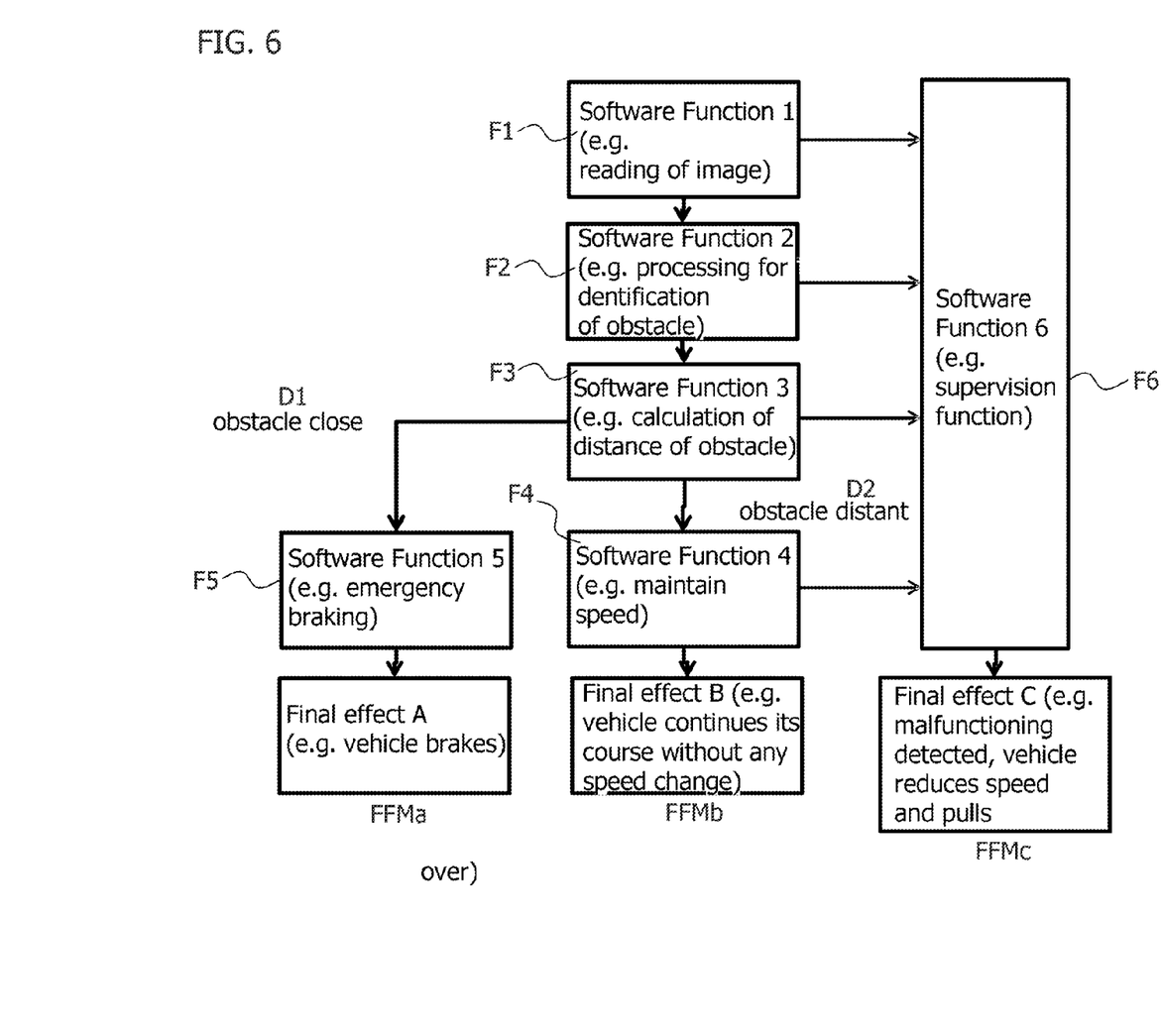
FIG. 6 shows a block diagram of a high-complexity application that can be tested applying the method described herein.

In order to explain the procedure, purely by way of example, the application A represented schematically in FIG. 6 may be considered, which is made up of some software functions Fi such as:

a function F1 that performs reading of the image captured by a CMOS video camera mounted on the vehicle;

a function F2 that carries out processing of the image to identify a possible obstacle;

a function F3 that carries out calculation of the distance of the possible obstacle from the vehicle;

a function F4 that, in the case of absence of obstacles, maintains the speed of the vehicle;

a function F5 that, in the case of a presence of obstacle at a close distance, carries out an emergency braking;

a function F6 that, in parallel with the others performs supervision, i.e., in the case where errors in operation of the system are detected, carries out an emergency procedure such as, for example, reduction of the speed of the vehicle and pulling over to one side.

In the framework of this example, assuming that the processor that is subject to the "stuck-at" fault to be injected MAXP is the one that computes the distance of a possible obstacle, a test scenario ST is a condition where there is the presence of a distant obstacle, in so far as what is to be verified is whether a possible hardware fault can cause the system to erroneously take a distant obstacle for a close obstacle and hence start an emergency braking when this is not necessary.

Figure 7:
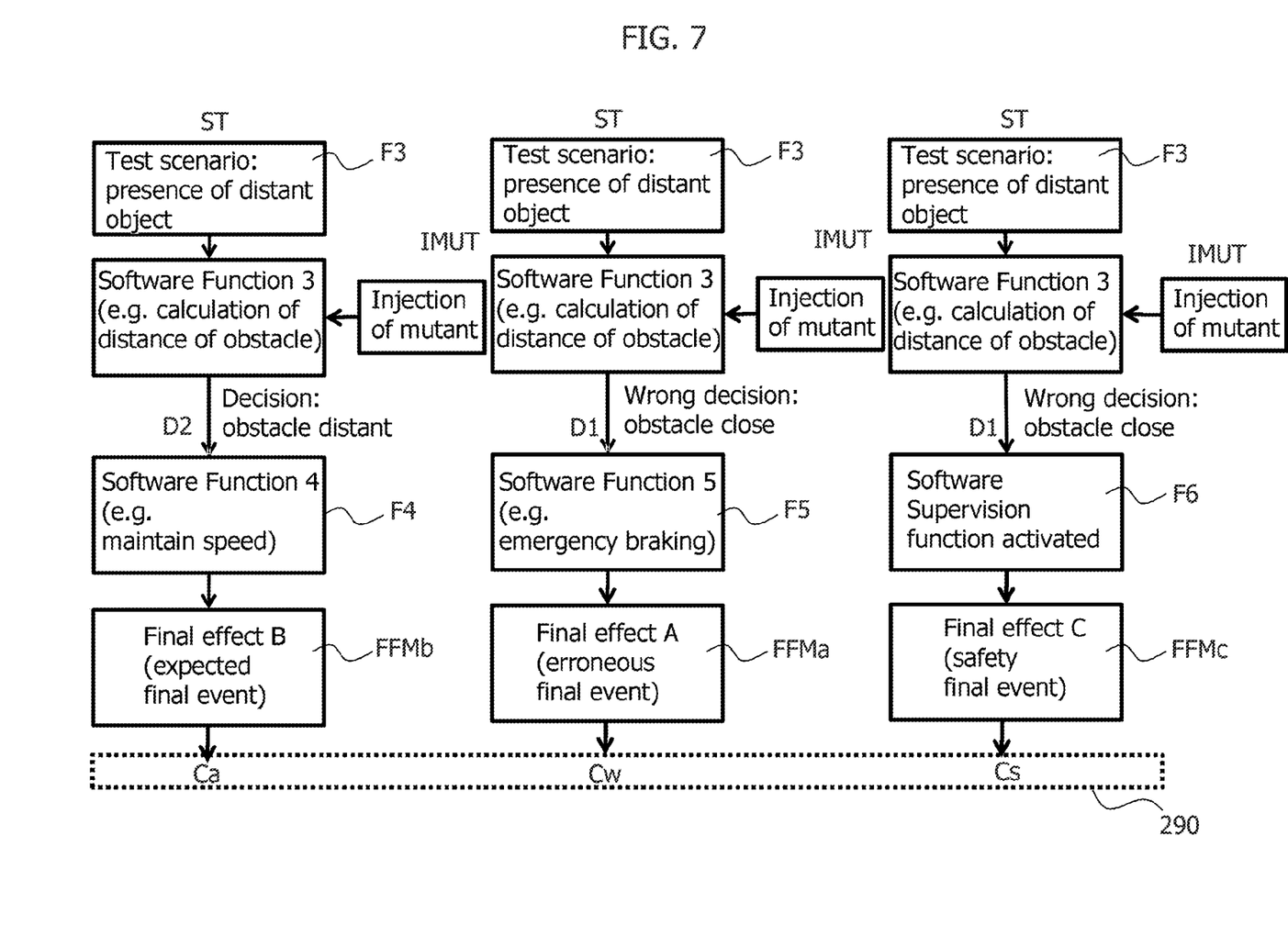
FIG. 7 illustrates an example of application of the method described herein to the application of FIG. 6.

FIG. 7 exemplifies the classification step 280, with reference to the application A described in FIG. 6. Execution of the mutated software model AM may cause three different final effects FMMb, FMMa, FMMc, which are, respectively, effect of expected event, effect of unexpected or erroneous event, and safety effect, each of which corresponds to a respective class Ca, Cs, Cw of effect described below:

class Ca of expected effect: the mutation is tolerated or else is without effect; in the example of FIG. 7, even though the function F3 has been mutated, the obstacle is always deemed distant (decision D2) and hence the final effect FMMb is the expected one; i.e., the speed of the vehicle is not modified;

class Cw of erroneous effect: the mutation causes malfunctioning; in the example, on account of the mutation of the function F3, the distant obstacle is instead considered as being close (decision D1), and hence the final effect FFMa is different from the expected one; i.e., an emergency braking is carried out when this is not necessary, with consequent potential danger for the driver who is set off-balance by the unexpected event;

class Cs of safety effect: the mutation could cause malfunctioning but is detected, and hence special procedures are implemented; in the example, the supervision function F6 detects potential malfunctioning, and the emergency procedure (referred to as "safety event", or "safety effect") is started; i.e., the vehicle reduces its speed and pulls over, notifying the driver of malfunctioning of the electronic system 11.

This classification step 280 is repeated for all the test scenarios ST and for all the mutants selected as mutants to be injected.

Figure 8:
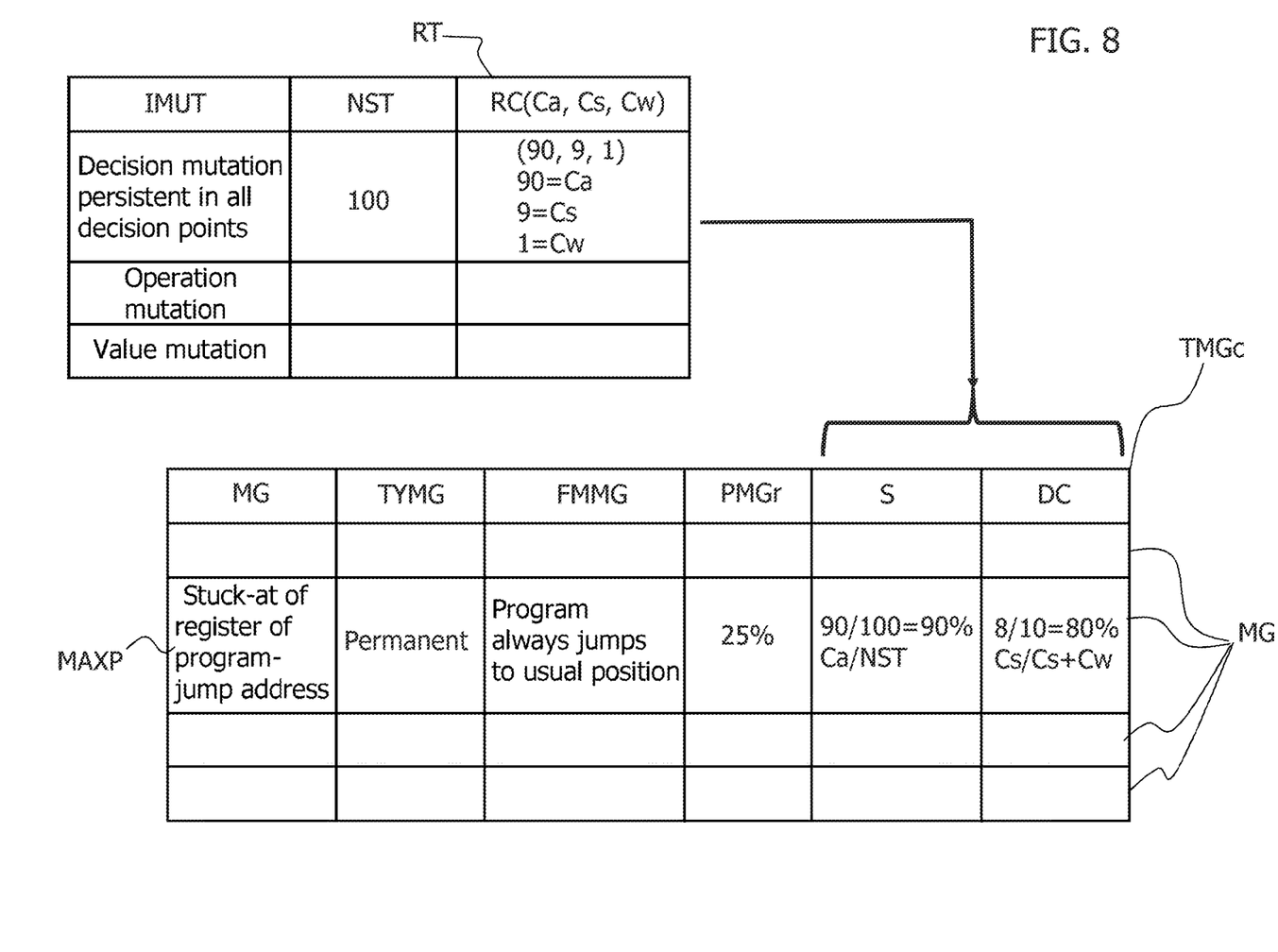
FIG. 8 shows a detailed diagram representing further operations of the method of FIG. 4.

FIG. 8 illustrates step 290, i.e., connection of the class Ca, Cs, Cw of final effect of an injected mutant IMUT with the relative probability of microscopic fault PMGr of the corresponding fault to be injected MAXP.

In the example represented in FIG. 8, tests are carried out 100 with a decision mutation that is persistent in all the decision points, as represented, for example, in FIG. 5. It is considered that the result R of a test is for 90 times the expected event FMMb, for 9 times the safety event FMMc, whereas for once the erroneous event FMMa. The results R for each injected mutant IMUT are given in the data structure of the result table RT, which is a classification data structure that has as for rows each injected mutant IMUT and as columns—in addition to the name, description, or identifier of the injected mutant IMUT—the number of scenarios NST injected, i.e., the number of tests, for that mutant IMUT, and the global result RC, which is grouped in values according to the classes Ca, Cs, Cw, i.e., in the example Ca=90, Cs=9, Cw=1. Basically, the global result RC is a triad (90, 9, 1) of values that correspond to each class.

The connection operation 290 is established for each fault to be injected IMUT in the following way:

the safe-fault fraction (also referred to as factor S) is computed as the ratio of the number of the tests NST carried out for the mutation IMUT corresponding to the aforesaid microscopic fault MG that have yielded as result the expected event FMMb to the total number of tests for the mutation IMUT corresponding to the aforesaid microscopic fault to be injected MAXP;

the diagnostic coverage (also referred to as factor DC) is the ratio of the number of the tests NST carried out for the mutation IMUT that corresponds to the aforesaid microscopic fault MG that have yielded as result the safety event FMMc to the number of the tests NST for the mutation IMUT that corresponds to the aforesaid microscopic fault MG that have yielded as result the safety event FMMc or the erroneous event FMMa.

These two factors, i.e., the safety factor S and the diagnostic-coverage factor DC, are determining values for the calculation of the functional-safety metrics envisaged in the standards cited, and FIG. 8 shows how the connection operation 290 generates a data structure connected to the results TMGc, which corresponds to the table TMG to which two columns or fields are added for the values of safety factor S and diagnostic-coverage factor DC that correspond to a given microscopic fault MG.

The steps 220, 261, 262, 250, 270, 280, 290 of the method may be repeated for all the microscopic faults in the microscopic-fault table TMG with significant relative probability PMGr (the simulation 270 being each time applied on a respective number NST of test scenarios), for example higher than a threshold, e.g., higher than 1%, choosing at each iteration as fault to be injected MAXP, the fault MG according to a decreasing order of relative probability PMGr. Steps 230 of building of the library LM and 240 of building of the software model of the application A are executed preferably just once, prior to step 220 of identification of the most probable faults.

Hence, from the foregoing description the advantages of the invention emerge clearly.

The solution described, in particular the method and the corresponding simulation system that implements the method, thus render possible in an extremely simple and automatic way the connection between microscopic hardware faults and their final effects. The use of software mutations enables execution of fault injection on a software model that is, even for extremely complex applications, both extremely fast and able to model, via the mutations, the effects caused by the aforesaid microscopic hardware faults.

The solution described, in addition to the drastic reduction in the measurement times, enables identification in a clear and complete way of the final effects of the microscopic hardware faults. This enables optimization of the supervision function, i.e., its modification in order to obtain—at the lowest possible cost—the highest possible value of diagnostic coverage (DC). In this way, a significant increase of functional safety of the device is obtained and consequently the reduction of the events dangerous for human life.

The solution described may be applied in an altogether similar way in the industrial, medical, and aeronautic fields.

Of course, without prejudice to the principle of the invention, the details and the embodiments may vary, even extensively, with respect to what has been described herein purely by way of example, without thereby departing from the sphere of protection, which is defined by the annexed claims.

The data structures described, in particular the tables, may be implemented through one or more databases, hosted on one or more computers, which may comprise the computer or computers that operate as simulation system.

The invention claimed is:

1. A method for measuring effect of microscopic hardware faults in applications that are implemented in a hardware electronic system, comprising performing on a processing system simulation of said electronic system or circuit that executes a software instance of said application, said simulation comprising injecting microscopic faults and measuring a corresponding final effect in said software instance of said application,
said injecting faults comprising:
selecting a microscopic fault to be injected; and
selecting, in a library of software mutants, a mutant corresponding to said microscopic fault to be injected;
wherein said selecting a microscopic fault to be injected comprises:
carrying out an analysis of the electronic system to identify a set of microscopic hardware faults to be injected, and
identifying in said set of microscopic hardware faults probable microscopic hardware faults; and
wherein said selecting, in a library of software mutants, a mutant corresponding to said microscopic fault to be injected comprises:
building a library of software mutants, in particular organized by type, persistence, and amount of mutants, and
selecting from said library mutants corresponding to the probable microscopic hardware faults.

2. The method according to claim 1, further comprising:
selecting or creating, as a function of the microscopic fault to be injected, a sequence of scenarios that comprise stress parameters for stressing the instance of the application;
said simulation and measurement being executed a plurality of times according to said sequence of scenarios.

3. The method according to claim 1, wherein said injecting faults further comprises:
applying said selected mutant to said software instance to obtain a mutated instance;
simulating said electronic system or circuit that executes said mutated instance in a given test scenario; and
measuring the effect corresponding to the mutated instance.

4. The method according to claim 3, wherein said measuring the effect corresponding to the mutated instance comprises detecting said final effect and classifying it according to classes of final effect, which in particular comprise classes of expected event, safety event, and erroneous event.

5. The method according to claim 4, further comprising computing safety indices of the microscopic fault as a function of results of said classifying.

6. The method according to claim 5, further comprising computing quantities representing the effect of the microscopic fault to be injected as a function of said safety indices.

7. The method according to claim 6, wherein said computing quantities that represent the effect of the microscopic fault to be injected as a function of said safety indices comprises computing an undetected-fault probability, as a product of a relative fault probability, of a complement of a safe-fault fraction, and of a complement of diagnostic coverage.

8. The method according to claim 6, wherein said computing of safety indices comprises:
computing a number of expected events, safety events, and erroneous events for a sequence of tests carried out with a given mutant; and
computing, as a function of said number of expected events, safety events, and erroneous events, values of a safe-fault fraction and diagnostic coverage and associating said indices to said microscopic fault selected.

9. The method according to claim 5, wherein said computing of safety indices comprises:
computing a number of expected events, safety events, and erroneous events for a sequence of tests carried out with a given mutant; and
computing, as a function of said number of expected events, safety events, and erroneous events, values of a safe-fault fraction and diagnostic coverage and associating said indices to said microscopic fault selected.

10. The method according to claim 5, wherein said classifying comprises collecting results of simulating in a classification data structure having records for each injected mutant comprising fields that correspond to a number of tests of a sequence and fields that correspond to a number of effects in each given class.

11. The method according to claim 10, wherein said computing safety indices comprises computing said safety indices for a given fault to be injected that is associated to a given injected mutant as a function of values contained in said classification data structure for said mutant, and entering said values into a further data structure obtained from said data structure of the microscopic faults, adding for each record corresponding to a microscopic fault fields corresponding to said safety indices, namely, indices of a safe-fault fraction and diagnostic coverage.

12. The method according to claim 3, wherein said identifying in said set of microscopic hardware faults probable microscopic hardware faults comprises ordering said microscopic hardware faults according to a value of relative fault probability and carrying out at least said selecting in a library of software mutants a mutant corresponding to said microscopic fault to be injected, applying said selected mutant to said software instance to obtain a mutated instance, simulating said electronic system or circuit that executes said mutated instance in a given test scenario, measuring the effect corresponding to the mutated instance, for each of said microscopic hardware faults that have a value of relative fault probability greater than a giventhreshold.

13. The method according to claim 12, wherein said identifying in said set of microscopic hardware faults the probable microscopic hardware faults comprises ordering said microscopic hardware faults according to the value of relative fault probability and carrying out at least said selecting in a library of software mutants a mutant corresponding to said microscopic fault to be injected, applying said selected mutant to said software instance to obtain a mutated instance, simulating said electronic system or circuit that executes said mutated instance in a given test scenario, measuring the effect corresponding to the mutated instance, for each of said microscopic hardware faults that have a value of relative fault probability greater than a giventhreshold.

14. The method according to claim 1, wherein said analysis comprises building a data structure of the microscopic faults, which comprises records for each possible microscopic hardware fault having fields indicating:
a given microscopic hardwarefault;
its type;
a failure mode; and
a relative fault probability.

15. A system for simulating faults in an electronic system that implement applications, comprising:
a processing system to carry out simulation of said electronic system or a circuit that executes a software instance of said application,
said simulation comprising injection of faults at a microscopic level and collection of measurements of a corresponding final effect in said software instance of said application; and
wherein said system is configured for carrying out the method according to claim 1.

16. One or more non-transitory computer readable media having a computer program product that can be loaded into memory of at least one computer, the computer program product comprising portions of software code that are designed to execute the method according to claim 1 when the program is run on the at least one computer.

* * * * *

UNITED STATES PATENT AND TRADEMARK OFFICE
CERTIFICATE OF CORRECTION

PATENT NO.         : 9,898,379 B2
APPLICATION NO.    : 14/928619
DATED              : February 20, 2018
INVENTOR(S)        : Riccardo Mariani It is certified that error appears in the above-identified patent and that said Letters Patent is hereby corrected as shown below:

In the Claims

Column 16
Line 4, "...giventhreshold." should read – ...given threshold.
Line 20, "...giventhreshold." should read – ...given threshold.
Line 25, "...hardwarefault;" should read – ...hardware fault;

Signed and Sealed this
Fifteenth Day of May, 2018

Andrei Iancu
*Director of the United States Patent and Trademark Office*